(12) United States Patent
Goto et al.

(10) Patent No.: US 10,284,169 B2
(45) Date of Patent: May 7, 2019

(54) BONDED BODIES AND ACOUSTIC WAVE DEVICES

(71) Applicant: NGK Insulators, Ltd., Nagoya, Aichi (JP)

(72) Inventors: Masashi Goto, Nagoya (JP); Yudai Uno, Nagoya (JP); Keiichiro Asai, Nagoya (JP); Tomoyoshi Tai, Inazawa (JP)

(73) Assignee: NGK INSULATORS, LTD., Nagoya, Aichi (JP)

( * ) Notice: Subject to any disclaimer, the term of this patent is extended or adjusted under 35 U.S.C. 154(b) by 0 days.

(21) Appl. No.: 16/102,209

(22) Filed: Aug. 13, 2018

(65) Prior Publication Data
US 2019/0007022 A1 Jan. 3, 2019

Related U.S. Application Data

(63) Continuation of application No. PCT/JP2018/011256, filed on Mar. 22, 2018.

(51) Int. Cl.
*H03H 9/25* (2006.01)
*H01L 41/09* (2006.01)
(Continued)

(52) U.S. Cl.
CPC .......... *H03H 9/02559* (2013.01); *H03H 3/08* (2013.01); *H03H 9/02031* (2013.01);
(Continued)

(58) Field of Classification Search
CPC .. H03H 9/02559; H03H 3/08; H03H 9/02031; H03H 9/0585; H03H 9/145; H03H 9/17; H03N 9/25
(Continued)

(56) References Cited

U.S. PATENT DOCUMENTS 5,032,884 A 7/1991 Yamagishi et al.
5,755,914 A 5/1998 Yonehara
(Continued)

FOREIGN PATENT DOCUMENTS

CN 86106353 A 12/1987
EP 0221523 A2 5/1987
(Continued)

OTHER PUBLICATIONS

International Search Report of corresponding application No. PCT/JP2018/011256 (3 pgs).
(Continued)

*Primary Examiner* — Thomas M Dougherty
(74) *Attorney, Agent, or Firm* — Flynn Thiel, P.C.

(57) ABSTRACT

An object is to improve insulation in a bonding layer and to improve a bonding strength of a supporting body and piezoelectric single crystal substrate, in a bonded body having the supporting body made of a polycrystalline material or single crystal material, the piezoelectric single crystal substrate and the bonding layer provided between the supporting body and piezoelectric single crystal substrate, wherein the bonded body includes the supporting body, piezoelectric single crystal substrate and the bonding layer provided between the supporting body and piezoelectric single crystal substrate, and the bonding layer has a composition of $Si_{(1-x)}O_x$ ($0.008 \leq x \leq 0.408$).

7 Claims, 3 Drawing Sheets

(51) Int. Cl.
*H03H 9/02* (2006.01)
*H03H 9/145* (2006.01)
*H03H 9/17* (2006.01)
*H03H 3/08* (2006.01)
*H03H 9/05* (2006.01)

(52) U.S. Cl.
CPC .......... *H03H 9/0585* (2013.01); *H03H 9/145* (2013.01); *H03H 9/17* (2013.01); *H03H 9/25* (2013.01)

(58) Field of Classification Search
USPC .......................................... 310/311–371, 800
See application file for complete search history.

(56) References Cited

U.S. PATENT DOCUMENTS

| | | | |
|---|---|---|---|
| 7,213,314 | B2 | 5/2007 | Abbott et al. |
| 7,331,092 | B2 | 2/2008 | Miura et al. |
| 8,264,303 | B2 | 9/2012 | Suzuki |
| 8,729,771 | B2 | 5/2014 | Kobayashi et al. |
| 9,438,201 | B2 | 9/2016 | Hori et al. |
| 9,564,574 | B2 | 2/2017 | Iwamoto |
| 2002/0149295 | A1 | 10/2002 | Onishi et al. |
| 2007/0028433 | A1 | 2/2007 | Abbott et al. |
| 2010/0123366 | A1* | 5/2010 | Chang .................. B06B 1/0292 310/300 |
| 2014/0009036 | A1* | 1/2014 | Iwamoto ............... H01L 41/053 310/348 |
| 2015/0263697 | A1* | 9/2015 | Zhang ................ H03H 9/02102 310/346 |
| 2016/0126458 | A1* | 5/2016 | Hiraoka ................. C09K 11/06 257/40 |
| 2018/0175377 | A1 | 6/2018 | Hirose et al. |

FOREIGN PATENT DOCUMENTS

| | | |
|---|---|---|
| JP | 62-106670 A | 5/1987 |
| JP | H6-077101 A | 3/1994 |
| JP | 3774782 B2 | 5/2006 |
| JP | 2010-187373 A | 8/2010 |
| JP | 2012-085286 A | 4/2012 |
| JP | 3184763 U | 7/2013 |
| JP | 2014-086400 A | 5/2014 |
| JP | 5668179 B1 | 2/2015 |
| JP | 5814727 B2 | 11/2015 |
| JP | 2017-010645 A | 1/2017 |
| TW | 201507353 A | 2/2015 |
| WO | WO 2011/158636 A1 | 12/2011 |
| WO | WO 2012-124648 A1 | 9/2012 |

OTHER PUBLICATIONS

Office Action of Taiwan Patent Office issued in Application No. 107109932 dated Dec. 7, 2018 (12 pages).
Office Action of Taiwan Patent Office issued in Taiwan Application No. 107109932 dated Mar. 8, 2019 (11 pages).

* cited by examiner

BONDED BODIES AND ACOUSTIC WAVE DEVICES

CROSS-REFERENCE TO RELATED APPLICATIONS

This is a continuation of International Application No. PCT/JP2018/011256, filed Mar. 22, 2018, which claims priority of Japanese Patent Application No. 2017-070219, filed Mar. 31, 2017, the entire contents of which are incorporated herein by reference.

TECHNICAL FIELD

The present invention relates to a bonded body of a piezoelectric single crystal substrate and supporting body, and an acoustic wave device utilizing the same.

BACKGROUND ARTS

It is known a surface acoustic wave device functioning as a filter device or oscillator used in mobile phones or the like and an acoustic wave device such as lamb wave device or film bulk acoustic resonator (FBAR) using a piezoelectric thin film. As such acoustic wave device, it is known a device produced by adhering a supporting body and a piezoelectric substrate propagating a surface acoustic wave and by providing interdigitated electrodes capable of oscillating the surface acoustic wave on a surface of the piezoelectric substrate. By adhering the supporting body whose thermal expansion coefficient is lower than that of the piezoelectric substrate onto the piezoelectric substrate, the change of a size of the piezoelectric substrate responsive to temperature change is reduced so that the change of the frequency characteristics as the surface acoustic wave device is reduced.

For example, it is proposed, in patent document 1, that a surface acoustic wave device having the structure produced by adhering a piezoelectric substrate and silicon substrate with an adhesive layer composed of an epoxy adhering agent.

Here, it is known that, in bonding a piezoelectric substrate and silicon substrate, a silicon oxide film is formed on a surface of the piezoelectric substrate, and a silicon substrate and the piezoelectric substrate are bonded through the silicon oxide film (patent document 2). In the case of the bonding, plasma beam is irradiated onto the surfaces of the silicon oxide film and silicon substrate to activate the surfaces, followed by the direct boding.

Further, it is known that a surface of the piezoelectric substrate is made a roughened surface, a filler layer is provided on the roughened surface to provide a flattened surface, and the filler layer is adhered onto a silicon substrate through an adhering layer (patent document 3). According to this method, an epoxy based or acryl based resin is used for the filler layer and adhering layer, and the bonding surface of the piezoelectric substrate is made the roughened surface to reduce the reflection of bulk wave and to reduce spurious wave.

Further, it is known direct bonding method of so-called FAB (Fast Atom Beam) system (patent document 4). According to this method, neutralized atomic beam is irradiated onto the respective bonding faces at ambient temperature to activate them, followed by direct bonding.

On the other hand, according to patent document 5, it is described that a piezoelectric single crystal substrate is directly bonded to a supporting body made of a ceramics (alumina, aluminum nitride, silicon nitride) and not to a silicon substrate, through an intermediate layer. Materials of the intermediate layer is silicon, silicon oxide, silicon nitride or aluminum nitride.

On the other hand, according to a composite substrate described in patent document 6, in the case that a piezoelectric substrate and supporting body are adhered through an organic adhesive layer, Rt (maximum cross sectional height of roughness curve) of an adhering surface of the supporting body to the piezoelectric substrate is made 5 nm or larger and 50 nm or smaller, so that it is possible to obtain the effect of preventing fracture by relaxing the stress.

According to patent document 7, in a surface acoustic wave device produced by adhering a piezoelectric substrate and supporting body through an adhesive layer, unevenness is formed in a bonding face of the piezoelectric substrate, a filler is applied on the bonding face to form a filler layer, and the filler layer and supporting body are bonded to each other. In this case, by providing the unevenness on the bonding face of the piezoelectric substrate, the arithmetic average surface roughness Ra is made 0.1 μm to prevent spurious wave due to reflection of the bulk wave. Further, Ra of the bonding face of the supporting body is made 10 nm to improve the bonding strength of the supporting body and filler layer.

PRIOR ART DOCUMENTS

Patent Documents (Patent document 1) Japanese Patent publication No. 2010-187373A
(Patent document 2) U.S. Pat. No. 7,213,314 B2
(Patent document 3) Japanese Patent No. 5814727 B
(Patent document 4) Japanese Patent publication No. 2014-086400A
(Patent document 5) Japanese Patent No. 3774782B
(Patent document 6) Japanese Registered Utility model No. 3184763
(Patent document 7) Japanese Patent publication No. 2012-085286A

SUMMARY OF THE INVENTION

Object to be Solved by Invention

However, depending on uses of bonded bodies, it is desired to increase an electrical resistance in the bonding layer and thereby to improve the insulation. For example, in the case of an acoustic wave device, the insulation of the bonding layer is increased so that noise and loss can be reduced. However, it is difficult to bond the supporting body with the bonding layer of a high resistance to the piezoelectric single crystal substrate at a high strength. Separation thus occurs between the piezoelectric single crystal substrate and supporting body in the subsequent processing steps.

An object of the present invention is, in a bonded body having a supporting body made of a polycrystalline ceramic or a single crystal material, a piezoelectric single crystal substrate and a bonding layer provided between the supporting body and piezoelectric single crystal substrate, to improve insulation in the bonding layer and to improve a bonding strength of the supporting body and piezoelectric single crystal substrate.

Means for Solving Object

The present invention provides a bonded body comprising:

a supporting body comprising a polycrystalline ceramic material or a single crystal material;

a piezoelectric single crystal substrate; and a bonding layer provided between the supporting body and piezoelectric single crystal substrate, the bonding layer having a composition of $Si_{(1-x)}O_x$ (0.008≤x≤0.408).

The present invention further provides an acoustic wave device comprising:

the bonded body; and an electrode provided on the piezoelectric single crystal substrate.

According to the present invention, in a bonded body having a supporting body made of a polycrystalline ceramic or a single crystal material, a piezoelectric single crystal substrate and a bonding layer provided between the supporting body and piezoelectric single crystal substrate, insulation in the bonding layer can be improved and a bonding strength of the supporting body and piezoelectric single crystal substrate can be improved.

MODES FOR CARRYING OUT THE INVENTION

The present invention will be described in detail below, appropriately referring to the drawings.

Figure 1A:
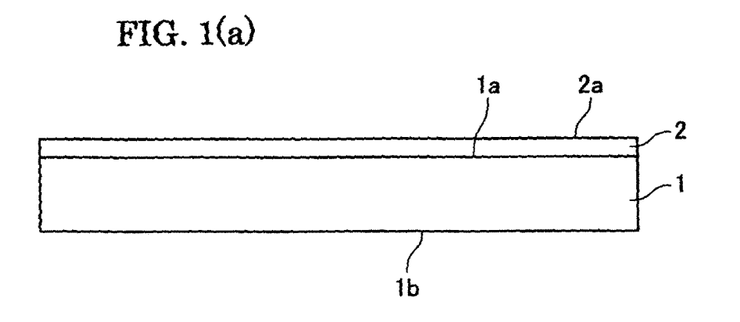
FIG. 1(a) shows the sate that a bonding layer 2 is provided on a supporting body 1 made of a polycrystalline ceramic material or single crystal material.
Figure 1B:
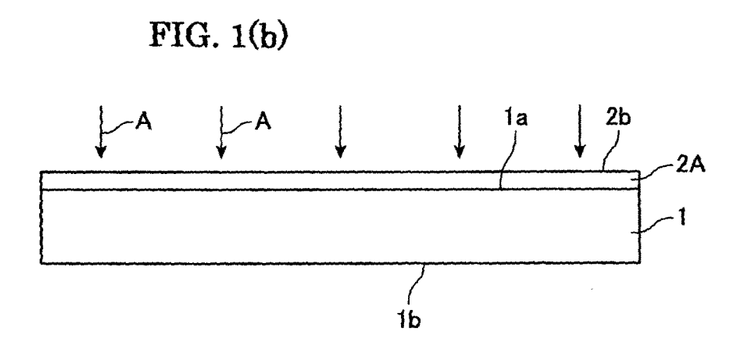
FIG. 1(b) shows the state that a surface 2b of the bonding layer 2 is activated by neutralized beam A.
Figure 1C:
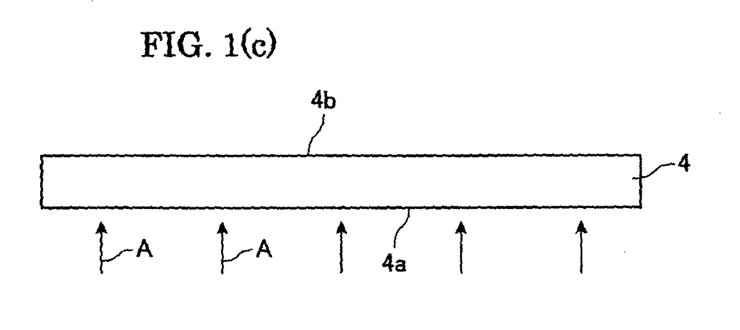
FIG. 1(c) shows the state that a surface 4a of a piezoelectric single crystal substrate 4 is activated by neutralized beam A.
Figure 2A:
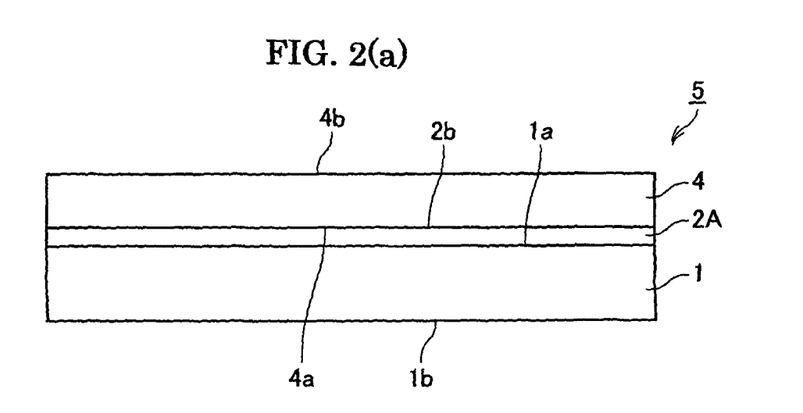
FIG. 2(a) shows the state that the piezoelectric single crystal substrate 4 is bonded with the supporting body 1.
Figure 2B:
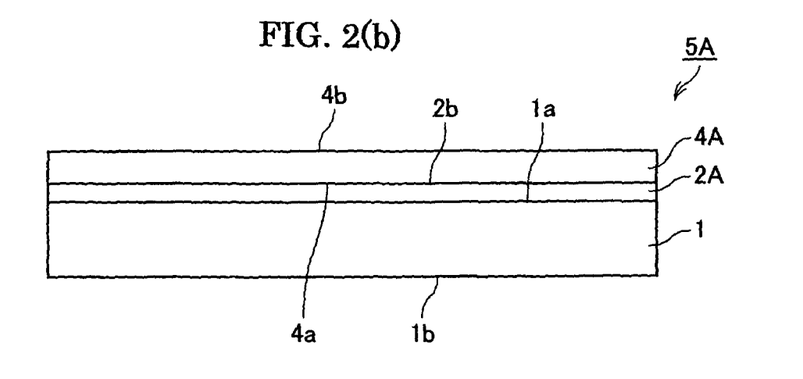
FIG. 2(b) shows the state that the piezoelectric single crystal substrate 4A is thinned by processing.
Figure 2C:
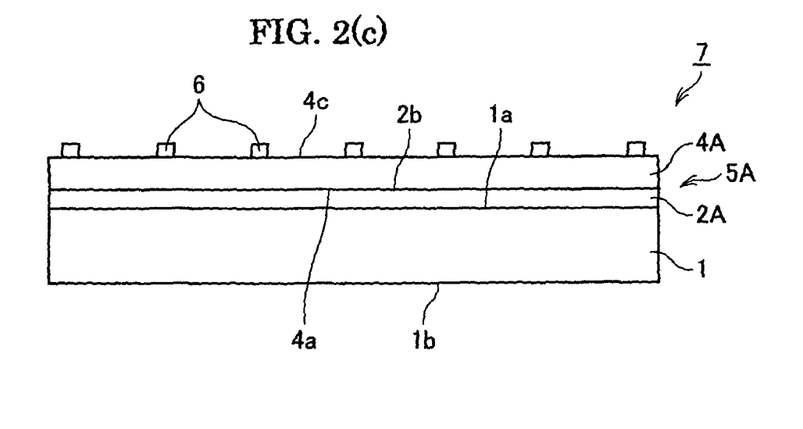
FIG. 2(c) shows the state that electrodes 6 are provided on a piezoelectric single crystal substrate 4A.

FIGS. 1 and 2 relates to an embodiment that a bonding layer is provided on a supporting body and then bonded to a surface of a piezoelectric single crystal substrate by direct bonding.

As shown in FIG. 1(a), a bonding layer 2 is provided on a surface 1a of a supporting body 1 made of a polycrystalline ceramic material or a single crystal material. 1b represents a surface on the opposite side. As this time, unevenness may be present on the surface 2a of the bonding layer 2.

Then, according to a preferred embodiment, the surface 2a of the bonding layer 2 is subjected to flattening process to form a flat surface 2b of the bonding layer as shown in FIG. 1(b). By this flattening process, a thickness of the bonding layer 2 is usually lowered to a thinner bonding layer 2A (refer to FIG. 1(b)). However, the flattening process is not indispensable. Then, neutralized beam is irradiated onto a surface 2b of the bonding layer 2A as an arrow A to activate the surface of the bonding layer 2A to obtain an activated surface.

On the other hand, as shown in FIG. 1(c), neutralized beam is irradiated onto a surface of a piezoelectric single crystal substrate 4 to activate it to provide an activated surface 4a. Then, as shown in FIG. 2(a), the activated surface 4a of the piezoelectric single crystal substrate 4 and the activated surface 2b of the bonding layer 2A are bonded by direct bonding to obtain a bonded body 5.

According to a preferred embodiment, the surface 4b of the piezoelectric single crystal substrate 4 of the bonded body 5 is further subjected to polishing, so that the thickness of the piezoelectric single crystal substrate 4A is made smaller as shown in FIG. 2(b), providing a bonded body 5A. 4c represents a polished surface.

According to FIG. 2(c), predetermined electrodes 6 are formed on a polished surface 4c of the piezoelectric single crystal substrate 4A to produce an acoustic wave device 7.

Figure 3A:
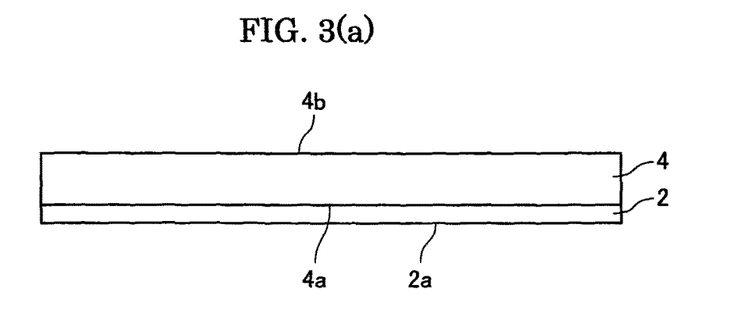
FIG. 3(a) shows the state that the bonding layer 2 is provided on the surface 4a of the piezoelectric single crystal substrate 4.
Figure 3B:
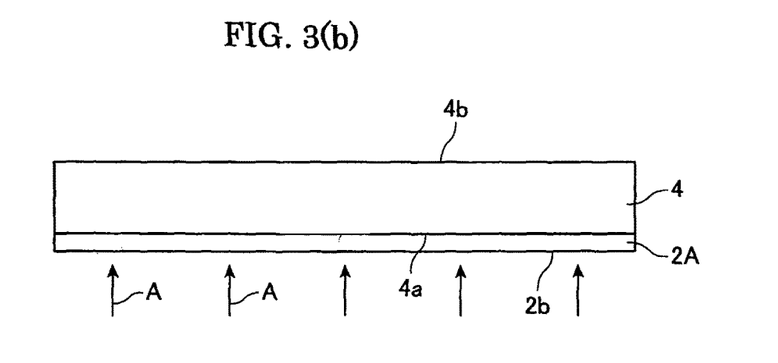
FIG. 3(b) shows the state that the surface 2b of the bonding layer 2A is activated by the neutralized beam A and FIG. 3(c) shows the state that the surface 1a of the supporting body 1 is activated by the neutralized beam A.
Figure 3C:
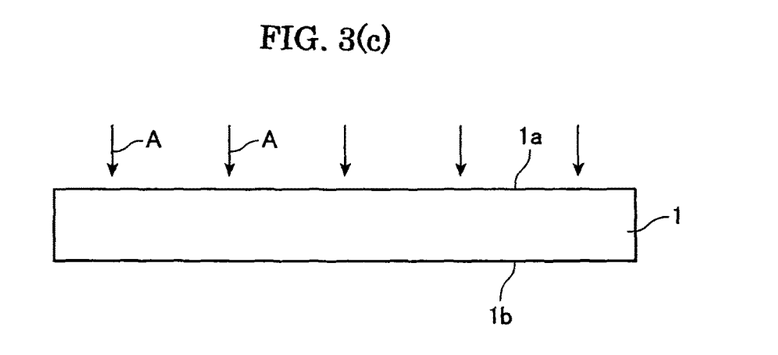

According to an example shown in FIG. 3, the bonding layer 2 is provided on a piezoelectric single crystal substrate 4 and bonded to the surface 1a of the supporting body 1 by direct bonding.

As shown in FIG. 3(a), the bonding layer 2 is provided on the surface 4a of the piezoelectric single crystal substrate 4. At this time, unevenness may be present on the surface 2a of the bonding layer 2.

Then, according to a preferred embodiment, the surface 2a of the bonding layer 2 is subjected to flattening process to provide a flat surface 2b of the bonding layer 2 as shown in FIG. 3(b). By this flattening process, the thickness of the bonding layer 2 is usually made smaller to a thinner bonding layer 2A (FIG. 3(b)).

However, the flattening process is not indispensable. Then, neutralized beam is irradiated onto the surface 2b of the bonding layer 2A as an arrow A so that the surface of the bonding layer 2A is activated to obtain the activated surface.

On the other hand, as shown in FIG. 3(c), neutralized beam is irradiated onto the surface of the supporting body 1 to activate it, providing the activated surface 1a. Then, as shown in FIG. 2(a), the activated surface 1a of the supporting body 1 and the activated surface of the bonding layer 2A are bonded by direct bonding to obtain a bonded body 5 (refer to FIG. 2(a)). Thereafter, as shown in FIGS. 2(b) and 2 (c), the surface 4b of the piezoelectric single crystal substrate 4 of the bonded body 5 is further subjected to polishing and predetermined electrodes 6 are formed on the polished surface 4c of the piezoelectric single crystal substrate 4A to produce an acoustic wave device 7.

The respective constituents of the present invention will be described further in detail below.

According to the present invention, the supporting body 1 is composed of a polycrystalline ceramic material or single crystal material. The single crystal material forming the supporting body 1 may preferably be silicon or sapphire. Further, the polycrystalline ceramic material may preferably be selected from the group consisting of mullite, cordierite, translucent alumina and sialon.

Specifically, as the material of the piezoelectric single crystal substrate, single crystals of lithium tantalate (LT), lithium niobate (LN), lithium niobate-lithium tantalate solid solution, quartz and lithium borate may be listed. Among them, LT or LN are more preferred. As LT or LN has a high propagation speed of a surface acoustic wave and large electro-mechanical coupling factor, it is preferred for use in a piezoelectric surface wave device for high frequency and wide-band frequency applications. Further, the normal direction of the main surface of the piezoelectric single crystal substrate 4 is not limited. However, in the case that the piezoelectric single crystal substrate 4 is made of LT, for example, it is preferred to use the substrate rotated toward Y-axis or Z-axis by 36 to 47° (for example 42°) with respect to X-axis, which is a direction of propagation of a surface acoustic wave, because of a low propagation loss. In the case that the piezoelectric single crystal substrate 4 is made of LN, it is preferred to use the substrate rotated toward Y-axis or Z-axis by 60 to 68° (for example 64°) with respect to X-axis, which is a direction of propagation of a surface acoustic wave, because of a lower propagation loss. Further, although the size of the piezoelectric single crystal substrate 4 is not particularly limited, for example, the diameter may be 50 to 150 mm and thickness may be 0.2 to 60 μm.

According to the present invention, it is provided the bonding layer 2 or 2A between the supporting body 1 and piezoelectric single crystal substrate 4 or 4A, and the bonding layer 2 or 2A has a composition of $SiO_{(1-x)}O_x$ ($0.008 \leq x \leq 0.408$). This composition is characterized in that the oxygen content is considerably lower than that in SiO2 (corresponding to x=0.667). The piezoelectric single crystal substrate 4 or 4A is bonded to the supporting body 1 through the bonding layer 2, 2A composed of the silicon oxide $Si_{(1-x)}O_x$ having the composition, so that it is possible to improve the bonding strength and to improve the insulation in the bonding layer 2 or 2A.

In the composition of $Si_{(1-x)}O_x$ forming the bonding layer 2 or 2A, when x is lower than 0.008, the electrical resistance of the bonding layer 2 or 2A is low and desired insulation cannot be obtained. Thus, x is made 0.008 or higher, preferably 0.010 or higher, more preferably 0.020 or higher and most preferably 0.024 or higher. Further, in the case that x is larger than 0.408, the bonding strength is lowered and the separation of the piezoelectric single crystal substrate 4 or 4A tends to occur. X is thus made 0.408 or lower, and more preferably 0.225 or lower.

The electrical resistance of the bonding layer 2 or 2A is preferably $4.8 \times 10^3$ Ω·cm or higher, more preferably $5.8 \times 10^3$ Ω·cm or higher, and most preferably $6.2 \times 10^3$ Ω·cm or higher. On the other hand, the electrical resistance of the bonding layer 2 or 2A is generally $1.0 \times 10^8$ Ω·cm or lower.

Although the thickness of the bonding layer 2 or 2A is not particularly limited, and it may be 0.01 to 10 μm and more preferably 0.05 to 0.5 μm, on the viewpoint of production cost.

Although the film-forming method of the bonding layer 2 or 2A is not particularly limited, sputtering, chemical vapor deposition (CVD) or vapor deposition method are listed. Here, more preferably, in reaction sputtering using a sputtering target of Si, an amount of oxygen gas flown into a chamber is adjusted so that the oxygen ratio (x) in the bonding layer 2 or 2a can be controlled.

Specific production conditions are appropriately selected depending on specifications of the chamber. According to preferred embodiment, the total pressure is made 0.28 to 0.34 Pa, the oxygen partial pressure is made $1.2 \times 10^{-3}$ to $5.7 \times 10^{-2}$ Pa, and the film-forming temperature is made ambient temperature. Further, B-doped Si may be listed as the Si target. As described later, along an interface of the bonding layer 2 or 2A and supporting body 1, an amount of B (boron) as an impurity is adjusted at about $5 \times 10^{18}$ atoms/cm$^3$ to $5 \times 10^{19}$ atoms/cm$^3$. It is thereby possible to assure the insulation of the bonding layer 2 or 2A.

According to a preferred embodiment, the surface 2b of the bonding layer 2 or 2A are directly bonded to the surface 4a of the piezoelectric single crystal substrate 4, or the surface 2b of the bonding layer 2 or 2A and the surface 1a of the supporting body 1 are directly bonded. In this case, the arithmetic average roughness Ra of the surface of the bonding layer 2 or 2A is preferably be 1 nm or lower and more preferably 0.3 nm or lower. Further, the arithmetic average roughness Ra of the surface 4a of the piezoelectric single crystal substrate 4 and the surface 1a of the supporting body 1 is preferably 1 nm or lower and more preferably 0.3 nm or lower. By this, the bonding strength of the piezoelectric single crystal substrate 4 or supporting body 1 and the bonding layer 2 or 2A is further improved.

The method of flattening the surfaces 2b of the bonding layer 2 and 2A, and surfaces 4a, 1a of the piezoelectric single crystal substrate 4 and supporting body 1 includes lapping, chemical mechanical polishing (CMP) and the like.

According to a preferred embodiment, the surfaces 2b of the bonding layers 2 and 2A and the surfaces 4a and 1a of the piezoelectric single crystal layer 4 and supporting body 1 can be activated by neutralized beam. Particularly, in the case that the surfaces 2b of the bonding layers 2 and 2A, surface 4a of the piezoelectric single crystal substrate 4 and surface 1a of the supporting body 1 are flat surfaces, the direct bonding can be easily performed.

When the activation of the surfaces is performed using the neutralized beam, it is preferred to use a system described in patent document 4 to generate the neutralized beam, which is irradiated. That is, it is used a high speed atomic beam source of saddle field type as the beam source. Then, an inert gas is introduced into the chamber and a high voltage is applied onto electrodes from a direct current electric source. By this, electric field of saddle field type generated between the electrode (positive electrode) and a housing (negative electrode) causes motion of electrons, e, so that atomic and ion beams derived from the inert gas are generated. Among the beams reached to a grid, the ion beam is neutralized at the grid, and the beam of neutral atoms is emitted from the high speed atomic beam source. Atomic species forming the beam may preferably be an inert gas (argon, nitrogen or the like).

A voltage during the activation by the irradiation of the beam may preferably be 0.5 to 2.0 kV and current is preferably 50 to 200 mA.

Then, the activated surfaces are contacted and bonded with each other under vacuum atmosphere. The temperature at this time may be ambient temperature, specifically 40° C. or lower and more preferably 30° C. or lower. Further, the temperature during the bonding may more preferably be 20° C. or higher and 25° C. or lower. The pressure at the bonding is preferably 100 to 20000N.

Applications of the bonded bodies 5 and 5A of the present invention are not particularly limited, and they can be appropriately applied to an acoustic wave device and optical device, for example.

As an acoustic weave device 7, a surface acoustic wave device, Lamb wave-type device, thin film resonator (FBAR) or the like is known. For example, the surface acoustic wave device is produced by providing an input side IDT (Interdigital transducer) electrodes (also referred to as comb electrodes or interdigitated electrodes) for oscillating surface acoustic wave and IDT electrode on the output side for receiving the surface acoustic wave on the surface of the piezoelectric single crystal substrate. By applying high frequency signal on the IDT electrode on the input side, electric field is generated between the electrodes, so that the surface acoustic wave is oscillated and propagated on the piezoelectric substrate. Then, the propagated surface acoustic wave is drawn as an electrical signal from the IDT electrodes on the output side provided in the direction of the propagation.

A metal film may be provided on a bottom surface of the piezoelectric single crystal substrate 4. After the lamb type device is produced as the acoustic wave device, the metal film plays a role of improving the electro-mechanical coupling factor near the bottom surface of the piezoelectric substrate. In this case, the lamb type device has the structure that interdigitated electrodes are formed on the surfaces 4b and 4c of the piezoelectric single crystal surface 4 and the metal film on the piezoelectric single crystal substrate 4 is exposed through a cavity provided in the supporting body 1.

Materials of such metal film includes aluminum, an aluminum alloy, copper, gold or the like, for example. Further, in the case that the Lamb wave device is produced, it may be used a composite substrate having the piezoelectric single crystal substrate 4 without the metal film on the bottom surface.

Further, a metal film and an insulating film may be provided on the bottom surface of the piezoelectric single crystal substrate 4. The metal film plays a role of electrodes in the case that the thin film resonator is produced as the acoustic wave device. In this case, the thin film resonator has the structure that electrodes are formed on the upper and bottom surfaces of the piezoelectric single crystal substrate 4 and the insulating film is made a cavity to expose the metal film on the piezoelectric single crystal substrate. Materials of such metal film includes molybdenum, ruthenium, tungsten, chromium, aluminum or the like, for example. Further, materials of the insulating film include silicon dioxide, phosphorus silicate glass, boron phosphorus silicate glass or the like.

Further, as the optical device, it may be listed an optical switching device, wavelength conversion device and optical modulating device. Further, a periodic domain inversion structure may be formed in the piezoelectric single crystal substrate 4.

In the case that the present invention is applied to the optical device, the size of the optical device can be reduced. Further, particularly in the case that the periodic domain inversion structure is formed, it is possible to prevent the deterioration of the periodic domain inversion structure by heat treatment. Further, the materials of the bonding layers 2 and 2A of the present invention are of high insulation, the generation of domain inversion is prevented during the processing by the neutralized beam before the bonding, and the shape of the domain inversion structure formed in the piezoelectric single crystal substrate 4 is hardly disordered.

EXAMPLES

Example A

Bonded bodies 5 and 5A of examples shown in tables 1 and 2 were produced, according to the method described referring to FIGS. 2 and 3.

Specifically, a substrate (LT substrate) of lithium tantalate having OF part, a diameter of 4 inches and thickness of 250 μm was used as the piezoelectric single crystal substrate 4. As the LT substrate, it was used LT substrate of 46° Y-cut X-propagation LT substrate, in which the direction of propagation of the surface acoustic wave (SAW) is X and the Y-cut plate is rotated in a cutting angle. The surface 4a of the piezoelectric single crystal substrate 4 was mirror-polished to an arithmetic average roughness Ra of 0.3 nm. However, Ra was measured by an atomic force microscope (AFM) in a visual field of 10 μm×10 μm.

Then, the bonding layer 2 was formed by direct current sputtering method on the surface 4a of the piezoelectric single crystal substrate 4. Boron-doped Si was used as the target. Further, oxygen gas was introduced as an oxygen source. At this time, an amount of introduced oxygen gas was changed as shown in tables 1 and 2, so that a total pressure of atmosphere and partial pressure of oxygen in the chamber were changed. The oxygen ratio (x) in the bonding layer 2 was thereby changed. The thickness of the bonding layer 2 was made 100 to 200 nm. The arithmetic average roughness Ra of the surface 2a of the bonding layer 2 was 0.2 to 0.6 nm. Then, the bonding layer 2 was subjected to chemical mechanical polishing (CMP) to a thickness of 80 to 190 μm and Ra of 0.08 to 0.4 nm.

On the other hand, as the supporting body 1, it was prepared the supporting body 1 having an orientation flat (OF) part, a diameter of 4 inches, a thickness of 500 μm and made of Si. The surfaces 1a and 1b of the supporting body 1 were finished by chemical mechanical polishing (CMP) so that each arithmetic average roughness Ra was made 0.2 nm.

Then, the flat surface 2b of the bonding layer 2A and the surface 1a of the supporting body 1 were cleaned to remove contamination, followed by introduction into a vacuum chamber. The chamber was evacuated to the order of $10^6$ Pa and high speed atomic beam (acceleration voltage of 1 kV and Ar flow rate of 27 sccm) was irradiated onto the bonding surfaces 1 and 2b of the respective substrates for 120 sec. Then, the beam-irradiated surface (activated surface) 2b of the bonding layer 2A and activated surface 1a of the supporting body 1 were contacted with each other, followed by pressurizing at 10000N for 2 minutes to bond the respective substrates 1 and 4 (refer to FIG. 2(a)). The thus obtained bonded bodies 5 of the respective examples were heated at 100° C. for 20 hours.

The surface 4b of the piezoelectric single crystal substrate 4 was ground and polished until the thickness was changed from the initial thickness of 250 μm to 1 μm (refer to FIG. 2(b)).

The thus obtained bonded bodied of the respective examples were subjected to the evaluation of the following properties.

(Ratio (x) of Oxygen in Bonding Layer 2A)

The bonding layer 2A formed on the piezoelectric single crystal substrate 4 was evaluated by Rutherford backscattering spectrometry under following conditions.

Apparatus: Pelletron 3SDH supplied by National Electrostatics Corporation
Conditions:
Incident ions: 4He$^{++}$
Energy of incidence: 2300 keV
Angle of incidence: 0 to 4 deg
Scattering angle: 110 deg
Current in sample: 10 nA
Beam size: 2 mmφ
In-plane rotation: None
Amount of irradiation: 70 μC Further, the ratios of oxygen contained in an interface of the supporting body 1 and bonding layer 2A and in the supporting body 1, as well as in the bonding layer 2A, under the above conditions.

(Electrical Resistivity)

The electrical resistivity (Ω·cm) of the bonding layer 2A formed on the piezoelectric single crystal substrate 4 was measured under the following conditions.

Apparatus: High resistance resistivity meter, Hiresta-UX MCP-HT800 (supplied by Mitsubishi Chemical Analytech Co. Ltd.)
(Conditions)
Probe: J box X type
Applied voltage; 1000V
Measuring time period: 10 seconds As shown in table 2 described below, in the examples 6 and 7, amounts of impurities in the bonding layer 2A formed on the piezoelectric single crystal substrate 4 were measured by a Quadrupole type secondary ion mass spectrometry system (D-SIMS) under the following conditions.

Apparatus: PHI ADEPT 1010
Conditions:
Primary ion specie: O$^{2+}$
Primary acceleration voltage: 3.0 kV As a result, B (boron) was detected as an impurity. An amount of boron was $7\times10^{18}$ atoms/cm$^3$ in the example 6 and $8\times10^{18}$ atoms/cm$^3$ in the example 7.

(Bonding Strength)

The bonding strengths of the bonded bodies of the respective examples were measured by crack-opening method.

However, in the case that bonding strength exceeds 1.75 J/m², the separation near the bonding layer 2A does not occur, resulting in bulk fracture in the bonded bodies 5 and 5A.

(Absence or Presence of Separation after Polishing)

The piezoelectric single crystal substrate 4 of the bonded body 5 was subjected to polishing, followed by visual observation of the absence or presence of separation of the piezoelectric single crystal substrate 4A.

The results were shown in tables 1 and 2.

TABLE 1

|  | Com. Ex. 1 | Ex. 1 | Ex. 2 | Ex. 3 | Ex. 4 | Ex. 5 |
|---|---|---|---|---|---|---|
| Amount of supplied oxygen during film formation (sccm) | 0 | 0.085 | 0.1 | 0.15 | 0.2 | 0.5 |
| Total pressure in chamber (Pa) | 0.28 | 0.28 | 0.29 | 0.29 | 0.29 | 0.29 |
| Oxygen partial pressure in chamber (Pa) | 0 | $1.2 \times 10^{-3}$ | $1.3 \times 10^{-3}$ | $1.9 \times 10^{-3}$ | $2.9 \times 10^{-3}$ | $7.2 \times 10^{-3}$ |
| Ratio of oxygen in Bonding layer (x) | Not higher than 0.0001 | 0.008 | 0.010 | 0.020 | 0.024 | 0.050 |
| Electrical resistivity ($\Omega \cdot$ cm) | $2.3 \times 10^2$ | $4.9 \times 10^3$ | $5.2 \times 10^3$ | $5.8 \times 10^3$ | $6.2 \times 10^3$ | $1.0 \times 10^4$ |
| Bonding strength (J/m²) | Bulk Fracture | Bulk Fracture | Bulk Fracture | Bulk Fracture | Bulk Fracture | Bulk Fracture |
| Presence or absence of Separation after polishing | None | None | None | None | None | None |

TABLE 2

|  | Ex. 6 | Ex. 7 | Ex. 8 | Ex. 9 | Com. Ex. 2 | Com. Ex. 3 |
|---|---|---|---|---|---|---|
| Amount of supplied oxygen during film formation (sccm) | 1.0 | 2.0 | 3.0 | 4.0 | 4.4 | 5.0 |
| Total pressure in Chamber (Pa) | 0.30 | 0.31 | 0.33 | 0.34 | 0.35 | 0.36 |
| Oxygen partial pressure in chamber (Pa) | $1.4 \times 10^{-2}$ | $3.1 \times 10^{-2}$ | $4.6 \times 10^{-2}$ | $5.7 \times 10^{-2}$ | $6.1 \times 10^{-2}$ | $7.7 \times 10^{-2}$ |
| Ratio of oxygen in Bonding layer (x) | 0.083 | 0.132 | 0.225 | 0.408 | 0.418 | 0.509 |
| Electrical resistivity ($\Omega \cdot$ cm) | $5.7 \times 10^4$ | $6.6 \times 10^5$ | $6.2 \times 10^6$ | $9.8 \times 10^6$ | $1.2 \times 10^7$ | $3.8 \times 10^7$ |
| Bonding strength (J/m²) | Bulk Fracture | Bulk Fracture | Bulk Fracture | Bulk Fracture | 1.3 | 1.2 |
| Presence or absence of Separation after polishing | None | None | None | None | Observed | Observed |

As can be seen from these results, as shown in the examples 1 to 9, in the case that the composition of the bonding layer 2A is within the range of the present invention (x is 0.008 or higher and 0.408 or lower), the bonding strength was high, the separation was not observed after the polishing and the electrical resistivity was high (The electrical resistivity was $4.9 \times 10^3$ $\Omega \cdot$cm or higher and $9.8 \times 10^6$ $\Omega \cdot$cm or lower).

On the contrary, in the composition of the bonded body 2A, as shown in the comparative example 1, in the case that the ratio (x) of the oxygen is low (x is 0.0001 or lower), the electrical resistivity of the bonding layer 2a became lower (the electrical conductivity was $2.3 \times 10^2$ $\Omega \cdot$cm). On the other hand, as shown in comparative examples 2 and 3, in the case that the ratio (x) of the bonding layer 2A is high (x is 0.418 or higher), the bonding strength was low, so that the bulk fracture did not occur and separation after the polishing occurred.

(Experiment B)

According to the present experiment B, different from the experiment A, as shown in FIGS. 1 and 2, the bonding layer 2 was formed on the supporting body 1 and not on the piezoelectric single crystal substrate 4.

Specifically, it was prepared the supporting body 1 having an orientation flat (OF) part, a diameter of 4 inches and a thickness of 500 μm. However, the materials of the supporting bodies 1 were silicon in example 10, mullite in example 11, sialon in example 12, translucent alumina in example 13 and sapphire in example 14. The surfaces 1a and 1b of the supporting body 1 were subjected to finishing by chemical mechanical polishing (CMP) so that the arithmetic average roughness Ra of each of the surfaces was 0.3 to 1.0 nm.

The piezoelectric single crystal substrate 4 was same as that in the experiment A.

The bonding layer 2A was formed on the surface 1a of the supporting body 1 as the experiment A. The flat surface 2b of the bonding layer 2A and surface 4a of the piezoelectric single crystal substrate 4 were then cleaned to remove contamination, followed by incorporation into the vacuum chamber. The chamber was evacuated to vacuum of the order of $10^{-6}$ Pa, and the high speed atomic beam (acceleration voltage of 1 kV and Ar flow rate of 27 sccm) was irradiated onto the bonding surface of each of the substrates for 120 sccm. Then, the beam-irradiated surface (activated surface) 2b of the bonding layer 2A and the activated surface 4a of the piezoelectric single crystal substrate 4 were contacted with each other, followed by pressurizing at 10000N for 2 minutes to bond both substrates (refer to FIG. 2(a)). Then, the thus obtained bonded bodies of the respective examples were heated at 100° C. for 20 hours.

Then, the surface 4b of the piezoelectric single crystal substrate 4 was ground and polished until the thickness was changed from the initial thickness of 250 μm to 1 μm (refer to FIG. 2(b)).

The ratio (x) of oxygen of the bonding layer 2A, electrical resistivity, bonding strength and presence or absence of separation after the polishing were evaluated for the thus obtained bonded bodies of the respective examples. The results were shown in table 3.

TABLE 3

| | Ex. 10 | Ex. 11 | Ex. 12 | Ex. 13 | Ex. 14 |
|---|---|---|---|---|---|
| Amount of supplied oxygen during film formation (sccm) | 1.0 | 1.0 | 1.0 | 1.0 | 1.0 |
| Total pressure in Chamber (Pa) | 0.30 | 0.30 | 0.30 | 0.30 | 0.30 |
| Oxygen partial pressure in chamber (Pa) | $1.4 \times 10^{-2}$ | $1.4 \times 10^{-2}$ | $1.4 \times 10^{-2}$ | $1.4 \times 10^{-2}$ | $1.4 \times 10^{-2}$ |
| Ratio of oxygen in Bonding layer (x) | 0.084 | 0.085 | 0.091 | 0.089 | 0.088 |
| Electrical resistivity ($\Omega \cdot$ cm) | $5.6 \times 10^4$ | $5.7 \times 10^4$ | $6.2 \times 10^4$ | $6.0 \times 10^4$ | $5.9 \times 10^4$ |
| Bonding strength (J/m$^2$) | Bulk Fracture | Bulk Fracture | Bulk Fracture | Bulk Fracture | Bulk Fracture |
| Presence or absence of Separation after polishing | None | None | None | None | None |

As can be seen from table 3 (examples 10 to 14) and example 6, in the case that the bonding layer 2A is formed on the side of the supporting body 1 and that various kinds of ceramic substrates were used as the supporting body 1, the insulation in the bonding layer 2A can be improved and the bonding strength of the supporting body 1 and the piezoelectric single crystal substrate 4 or 4A can be improved.

According to the description described above, the bonding layer 2A is provided on the surface 1a of the supporting body 1 or the surface 4a of the piezoelectric single crystal substrate 4. However, it is not limited to this, and the bonding layer 2A may be provided over the supporting body with another bonding layer (for example SiO$_2$) provided in advance (in other words, another bonding layer may be provided between the bonding layer 2A and supporting body 1). Further, the bonding layer 2A may be provided over the piezoelectric single crystal substrate 4 with another bonding layer (for example SiO$_2$) in advance (In other words, another bonding layer may be provided between the bonding layer 2A and piezoelectric single crystal substrate 4).

The invention claimed is:

1. A bonded body comprising:
   a supporting body comprising a polycrystalline ceramic material or a single crystal material;
   a piezoelectric single crystal substrate; and
   a bonding layer provided between said supporting body and said piezoelectric single crystal substrate, said bonding layer having a composition of Si$_{(1-x)}$O$_x$ ($0.008 \leq x \leq 0.408$).

2. The bonded body of claim 1, wherein said bonding layer has an electrical resistivity of $4.9 \times 10^3$ $\Omega \cdot$cm or higher.

3. The bonded body of claim 1, wherein a surface of said bonding layer and a surface of said piezoelectric single crystal substrate are bonded by direct bonding.

4. The bonded body of claim 1, wherein a surface of said supporting body and said bonding layer is bonded by direct bonding.

5. The bonded body of claim 1, wherein said supporting body comprises a material selected from the group consisting of silicon, sapphire, mullite, cordierite, translucent alumina and sialon.

6. The bonded body of claim 1, wherein said piezoelectric single crystal substrate comprises lithium niobate, lithium tantalate or lithium niobate-lithium tantalate solid solution.

7. An acoustic wave device comprising:
   said bonded body of claim 1; and
   an electrode provided on said piezoelectric single crystal substrate.

* * * * *

UNITED STATES PATENT AND TRADEMARK OFFICE
CERTIFICATE OF CORRECTION

PATENT NO. : 10,284,169 B2
APPLICATION NO. : 16/102209
DATED : May 7, 2019
INVENTOR(S) : Masashi Goto et al.

Page 1 of 1

It is certified that error appears in the above-identified patent and that said Letters Patent is hereby corrected as shown below:

On the Title Page

Item [30], insert:
--March 31, 2017 (JP) . . . . . 2017-070219--

Signed and Sealed this
Twenty-third Day of July, 2019

Andrei Iancu
*Director of the United States Patent and Trademark Office*